United States Patent [19]

Ellis et al.

[11] Patent Number: 5,157,635

[45] Date of Patent: Oct. 20, 1992

[54] INPUT SIGNAL REDRIVER FOR SEMICONDUCTOR MODULES

[75] Inventors: Wayne F. Ellis, Jericho, Vt.; Erich Klink, Schoenaich; Knut Najmann, Gaertringen, both of Fed. Rep. of Germany

[73] Assignee: International Business Machines Corporation, Armonk, N.Y.

[21] Appl. No.: 728,831

[22] Filed: Jul. 9, 1991

Related U.S. Application Data

[63] Continuation of Ser. No. 457,470, Dec. 27, 1989, abandoned.

[51] Int. Cl.$^5$ .................................................. G11C 8/00
[52] U.S. Cl. ............................ 365/230.06; 365/230.03
[58] Field of Search ..................... 365/230.03, 230.05, 365/230.06; 307/475, 557, 558, 562, 443

[56] References Cited

U.S. PATENT DOCUMENTS

| | | | |
|---|---|---|---|
| 4,262,340 | 4/1981 | Sasaki et al. | 365/230.06 |
| 4,598,410 | 7/1986 | Smith et al. | 375/3 |
| 4,698,826 | 10/1987 | Denhez et al. | 375/3 |
| 4,859,877 | 8/1989 | Cooperman et al. | 307/443 |
| 4,882,706 | 11/1989 | Sinclair | 365/230.05 |
| 4,945,264 | 7/1990 | Lee et al. | 307/443 |
| 5,019,726 | 5/1991 | Sanwo et al. | 307/475 |

FOREIGN PATENT DOCUMENTS 5694187  6/1983  Japan .............................. 385/230.06

OTHER PUBLICATIONS

IBM Technical Disclosure Bulletin, vol. 26, No. 10A, Mar. 1984, pp. 5147-5152, "Extended Data Bus with Direction and Enable Control Features" H. C. Lin et al.
IBM Technical Disclosure Bulletin, vol. 32, No. 7, Dec. 1989, pp. 454-455, "5-Volt Signal Level Shifter in a 3-Volt CMOS Circuit".

Primary Examiner—Stuart S. Levy
Assistant Examiner—Jack A. Lane
Attorney, Agent, or Firm—Howard J. Walter, Jr.

[57] ABSTRACT

A semiconductor packaging subassembly is described in which a plurality of modules or chips, repsonsive to a plurality of common input signals, are provided with input signal redriver circuits. Each redriver circuit is responsive to an input and provides an output signal to each the of chips in the subassembly. The preferred embodiment is directed to a multi-module memory arrangement in which input signals including CAS, RAS, W and address signals are received and redriven.

5 Claims, 3 Drawing Sheets

INPUT SIGNAL REDRIVER FOR SEMICONDUCTOR MODULES

This is a continuation of copending application Ser. No. 07/457,470 filed on Dec. 27, 1989 now abandoned.

FIELD OF THE INVENTION

This invention relates to the packaging and assembly of semiconductor devices into functional units, and particularly to the packaging of pluralities of semiconductor devices having common input signal lines.

BACKGROUND OF THE INVENTION

In the development of semiconductor packaging technology it has been the experience that succeeding generations of products of similar function, but having far greater density, are used to replace earlier production versions. One of the packaging constraints placed on the superseding product is a desire that a plurality of substantially identical semiconductor devices be mounted on a common carrier, be it a module or an integrated circuit card. Because of the increased capacitive loading encountered by the multiplication of circuit devices, input signal drivers originally designed for a single integrated circuit are required to drive several circuit devices.

In fabricating semiconductor memory devices it is common to package a number of memory chips or modules on a single assembly or subassembly identified as a single in-line package (SIP) or a single in-line memory module (SIMM) in which all of the memory components share a plurality of signal lines. The total capacitive load to be driven can approach several nano-farads for a single net driver.

An additional problem associated with the application of signals to semiconductor devices in such packages is the presence of net switching delays resulting in degraded system performance. Increases in performance by higher density technologies may be overwhelmed by increases in net loading.

A common practice in situations where several integrated devices, such as memory modules, are required to be responsive to common input signals is to provide discrete logic signal driver modules in addition to functional logic or memory modules required by the application. For example, in a particular application, a computer system might be designed to have a memory capacity of 1 Megabyte of storage. This would typically be implemented by providing a memory card including nine (9) 1Mbit dynamic random access memory (DRAM) modules. Since the initial memory and the remainder of the system were designed simultaneously, digital signal drivers are performance matched to the DRAMs provided. That is, the circuits designed by the, separately packaged, control processors are custom designed to provide logic signals, select and address signals, for 1M DRAM devices.

A subsequent enhanced product might offer a 4M Byte DRAM card which poses a problem in that the logic signals provided are incapable of driving the denser card. This problem has been solved by the provision of a DRAM module package containing one or more logic signal driver modules to redrive those signals intended to be coupled to the new 4M Byte card. The application of such independent signal driver modules is described in the representative prior art such as the article "Extended Data Bus with Direction and Enable Control Features," by H. C. Lin et al, IBM Technical Disclosure Bulletin, Vol. 26, No. 10A, March 1984, pp. 5147-5152 or in U.S. Pat. No. 4,598,410 to Smith et al or in U.S. Pat. No. 4,698,826 to Denhez et al.

Because of the adaptation of the system to accommodate increased memory capacity, usually in the form of a circuit module or card designed to fit a physically constrained area, a problem is presented in how to physically place the increased capacity memory modules plus and one or more redriver modules in the space designed for memory modules alone. In addition, the requirement for separate redriver modules increases the cost of adding additional memory capacity by the cost of the redriver modules in addition to any increase due to the new memory modules and their associated packaging.

This invention enables the addition of modules having similar function, particularly in the case of memory modules, to a system without concern for physical space constraints or additional cost.

SUMMARY OF THE INVENTION

In accordance with the present invention, additional modules having at least some common input signal requirements, can be provided without concern for physical space restraints or additional cost. This objective is achieved by providing within the logic or DRAM device the capability of redriving one or more input signals intended for others of the added modules. If a sufficient number of modules are required, the number of redrivers per added module can be optimized at one redriver per module.

It is an object of the invention to provide a plurality of similar semiconductor devices, each requiring a common subset of input signals, with at least one input signal driver circuit responsive to an input signal and for providing an output signal coupled to a plurality of devices having the same input signal requirements. That is, for each of a plurality of like-function devices, there is provided a redriver circuit responsive to an input signal which provides an output signal coupled to all of the plurality of like-function devices.

Another object of the invention is to reduce the cost of providing increased capacity of semiconductor subassemblies (cards) without the provision of additional semiconductor modules for signal redrive.

These and other objectives and advantages will be apparent from the detailed description of the invention.

DETAILED DESCRIPTION OF THE INVENTION

Figure 1:
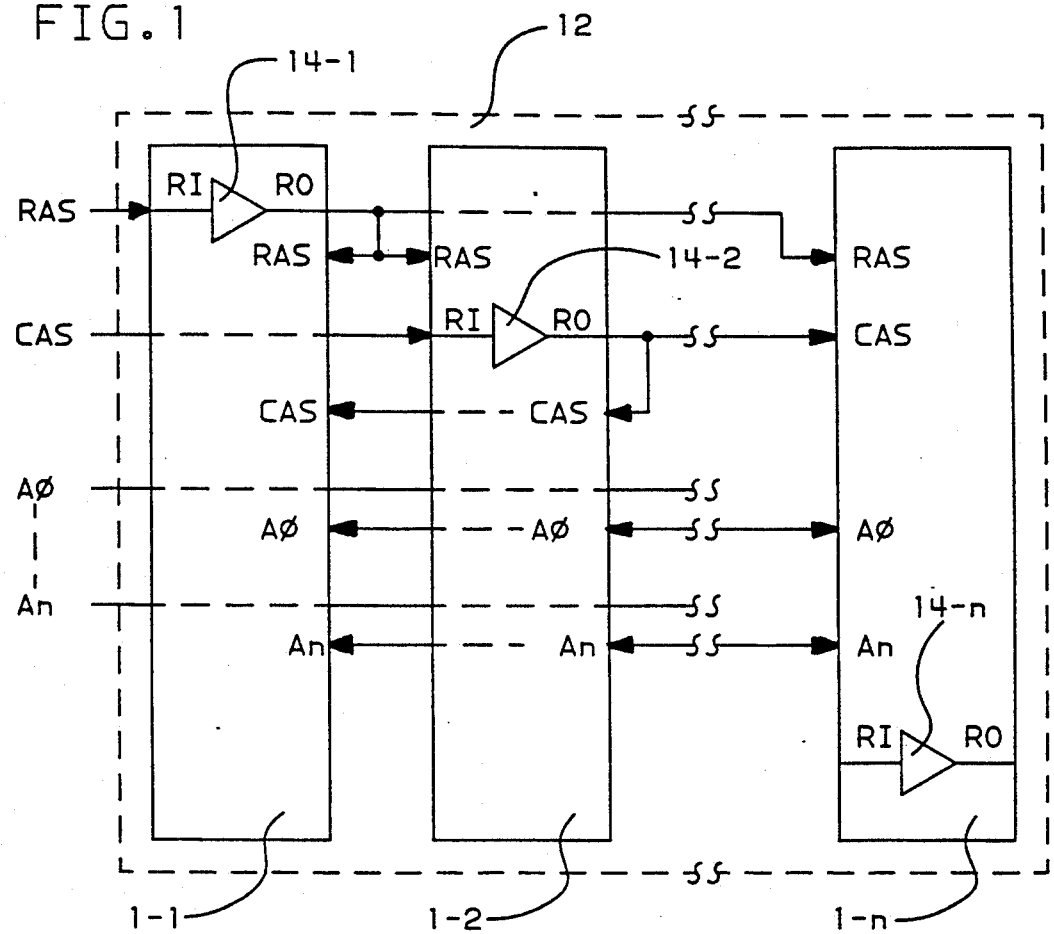
FIG. 1 is a schematic representation of an expansion memory package of the invention showing the relationship between the input signals applied to the package and the connections to the plurality of memory modules.

Referring to FIG. 1, an embodiment of the invention is shown in the form of an assembly of a plurality of semiconductor devices 1-1, 1-2 . . . 1-n mounted on a common substrate 12. The devices are representative of any of a number of devices in which a plurality of devices requiring at least some common input signals are required by a particular application. In the preferred embodiment, these semiconductor devices may be memory modules mounted in a SIMM or SIP configuration. As shown each memory device requires a number of input signals such as row access strobe RAS, column access strobe CAS, address inputs A0 . . . An, as well as read/write inputs, one or more data inputs and driver devices, to all of the memory devices 1-1 . . . 1-n. In the configuration of the invention, it is a primary feature to provide, as a portion of the circuitry on each semiconductor device, an input signal redriver or buffer circuit 14-1, 14-2 . . . 14-n. Each memory device contains one or more isolated redriver circuits 14, each having an associated redrive input RI and redrive output RO. As shown in FIG. 1, each memory device includes one redriver circuit, although any number can be provided. The RAS input signal is applied to the RI input of device 1-1, while the output RO of redriver 14-1 is coupled, via the subassembly wiring to the RAS input of each of the memory devices, including device 14-1. In a similar manner, the input CAS is initially applied to the RI input of device 1-2 and its output RO is coupled to the CAS input of each of the memory devices.

In the design of the individual memory devices 1, the number of redriver circuits depends upon the total number of input signals anticipated in the multi-device subassembly 12. Where the number of input signals is less than the number of devices, one or more redriver circuits may be left unconnected, as shown in device 1-n.

Figure 2:
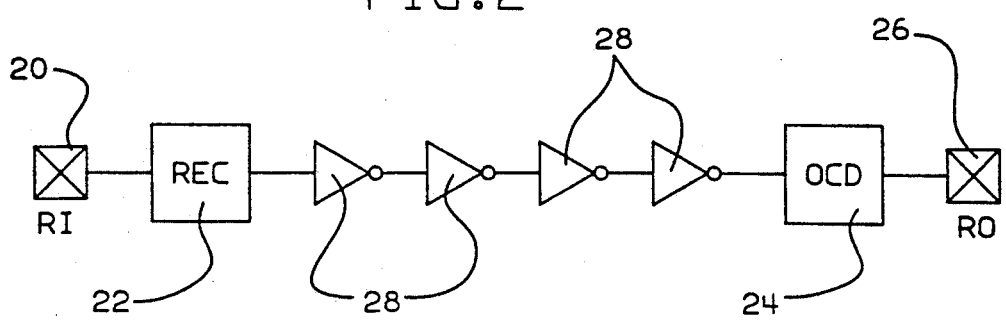
FIG. 2 is a schematic circuit representation of the redriver of the invention as embodied within a single DRAM module.

FIG. 2 illustrates a typical schematic representation of a single redriver circuit 14. Included are an input pad 20, a receiver circuit 22, an off-chip driver (OCD) circuit 24, an output pad 26, and one or more inverter driver circuits 28. The number of inverter driver circuits 28 required, if any, depends on the particular technology and ability to obtain an adequate signal level required by the off-chip driver 24. In the preferred embodiment, it was the designer's choice to simplify the design of the receiver 22 and the OCD, these circuits were designed to be substantially identical to the individual receiver and OCD circuits already required by the memory devices when the redriver feature is not used. Therefore a total of four inverter driver circuits 28 were required, each being capable of driving a higher output load.

Figure 3:
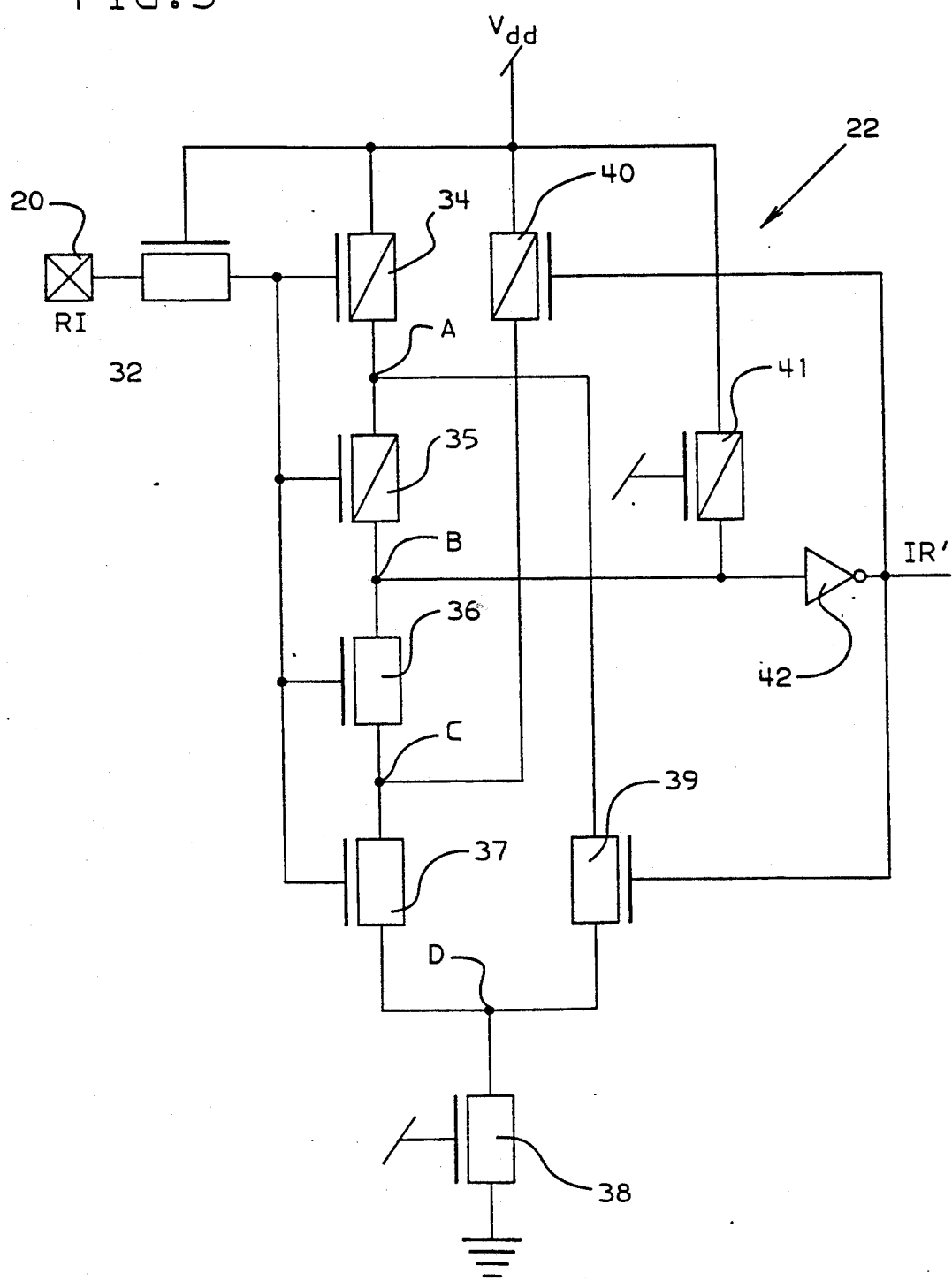
FIG. 3 is a detailed circuit diagram of a typical input receiver circuit for receiving the logic signals applied to the redriver of the invention.

Referring now to FIG. 3, there is shown the detailed circuit schematic of a receiver circuit 22 useful in implementing the invention. The receiver comprises a level sensitive CMOS embodiment of a Schmitt trigger circuit. Briefly, the circuit operates in response to the signal level provided on device input pad 22 which is applied through device 32 to the gates of devices 34, 35, 36 and 37. When the input signal is high devices 34 and 35 are biased off and devices 36 and 37 are biased on. Device 32 is permanently biased on by having its gate coupled to supply potential Vdd. Voltage node B coupled to the input of inverter 42 is held low forcing the Intermediate Redrive node IR' high.

Figure 4:
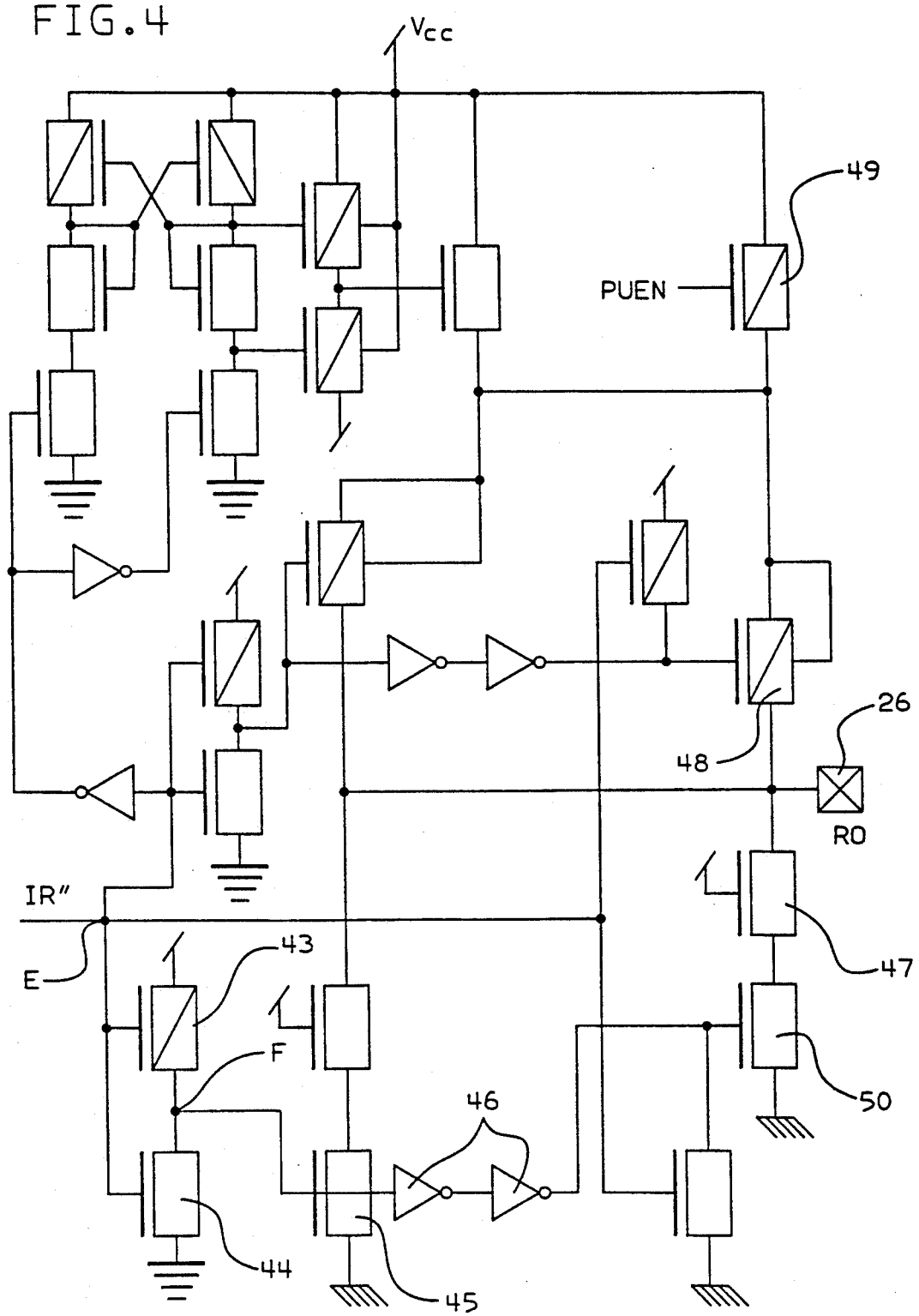
FIG. 4 is a detailed circuit diagram of a typical off-chip driver for providing the output signals of the invention.

FIG. 4 is a detailed circuit schematic of the OCD circuit of the preferred embodiment. Briefly, the OCD circuit operates as follows. Because the internal circuitry uses a drain supply voltage Vdd of 3 volts and the OCD requires an output level Vcc of 5 volts a conversion of levels is required to be performed by the OCD. The internal redriver signal IR" received by the OCD is applied to the voltage node E and to the gates of devices 43 and 44 which form an inverter, driving node F. The signal at node F, in turn, is applied through inverters 46 to the gate of pull-down device 50 which drives the redriver output signal RO on device pad 26. The p-type pull-up device 49 has its gate coupled to a Power Up Enable signal PUEN generated within the memory device which prevents the output terminals of the device, such as redriver output RO from drawing unusually large amounts of current during power up sequencing when power is initially applied to the semiconductor subassembly or card. The article "5-Volt Signal Level Shifter in a 3-Volt Circuit" IBM Technical Disclosure Bulletin, Vol. 32, No. 7, pages 454-455, December 1989, describes the circuit in greater detail.

Thus, in accordance with the invention it has been shown that the performance provided by enhanced semiconductor technology need not be compromised by a requirement of additional space or circuit modules. With respect to the preferred embodiment, the following improvements are achieved by implementation of the features of the invention. Simultaneous switching of signal levels is distributed across the entire subassembly or card. The net switching delays are reduced, as is the net load Area required for a discrete buffer/driver module is not required. Impedance matching between buffer and receiving devices is not a concern. The performance of the redrive circuitry will track with that of its associated functional devices. All generational improvements made in the functional device technology will be translated into subassembly or card level improvements.

While the invention has been described with respect to a single embodiment, those skilled in the art will easily see that extensions and variations can be made without deviating from the invention. Various modifications in the embodiment described may be made without departing from the spirit of the invention.

What is claimed is:

1. A semiconductor subassembly comprising a plurality of discrete semiconductor devices each having a plurality of input and output terminals, each semiconductor device being responsive to at least one common input signal to be applied to a plurality of the semiconductor devices, the improvement comprising:

redriver means being an integral part of a first one of said discrete semiconductor devices, each redriver means being responsive to said at least one common input signal applied to said subassembly for providing a redriver output signal to a redriver output terminal of said first one of said discrete semiconductor devices, and means for connecting said redriver output terminal to an input terminal of at least one of said plurality of said semiconductor devices, including said first one of said semiconductor devices.

2. The semiconductor subassembly of claim 1 wherein said subassembly includes at least one semiconductor memory module.

3. The semiconductor subassembly of claim 2 wherein said semiconductor memory module comprises at least tow semiconductor memory devices.

4. The semiconductor subassembly of claim 1 wherein at least one of said semiconductor devices comprises a semiconductor memory device.

5. A semiconductor memory assembly comprising a plurality of memory modules, each memory module having a plurality of input terminals, each memory module being responsive to a plurality of input signals, at least one of said input signals is to be provided to all of said memory modules, the improvement comprising:

a plurality of redriver circuit means, each being an integral part of a different memory module, at least one of said redriver circuit means being responsive to said one of said plurality of input signals applied to said assembly for generating output signals to be provided to an input terminal of each of said memory modules, including the memory module with which said redriver circuit means is an integral part.

* * * * *